US008138508B2

(12) United States Patent
Wang et al.

(10) Patent No.: US 8,138,508 B2
(45) Date of Patent: Mar. 20, 2012

(54) LED CHIP PACKAGE STRUCTURE WITH DIFFERENT LED SPACINGS AND A METHOD FOR MAKING THE SAME

(75) Inventors: Bily Wang, Hsinchu (TW); Shih-Yu Wu, Banciao (TW); Wen-Kuei Wu, Hukou Township, Hsinchu County (TW)

(73) Assignee: Harvatek Corporation, Hsinchu (TW)

( * ) Notice: Subject to any disclaimer, the term of this patent is extended or adjusted under 35 U.S.C. 154(b) by 715 days.

(21) Appl. No.: 12/285,190

(22) Filed: Sep. 30, 2008

(65) Prior Publication Data

US 2009/0206350 A1 Aug. 20, 2009

(30) Foreign Application Priority Data

Feb. 20, 2008 (TW) ............................... 97105951 A

(51) Int. Cl.
*H01L 33/00* (2010.01)

(52) U.S. Cl. ................ 257/88; 257/79; 257/98; 257/99; 257/100; 257/E33.058; 257/E33.061; 438/26; 438/27; 438/28; 362/612

(58) Field of Classification Search .................... 257/79, 257/88, 98, 99, 100, E33.058, E33.061; 438/26, 438/27, 28; 362/612
See application file for complete search history.

(56) References Cited

U.S. PATENT DOCUMENTS

| | | | | |
|---|---|---|---|---|
| 2005/0073840 A1* | 4/2005 | Chou et al. | .................... | 362/238 |
| 2008/0012035 A1* | 1/2008 | Wang et al. | ..................... | 257/99 |
| 2008/0179604 A1* | 7/2008 | Wang et al. | ..................... | 257/91 |
| 2008/0186733 A1* | 8/2008 | Ho et al. | ....................... | 362/610 |
| 2009/0065789 A1* | 3/2009 | Wang et al. | ..................... | 257/88 |

* cited by examiner

*Primary Examiner* — Eugene Lee
*Assistant Examiner* — Peniel M Gumedzoe
(74) *Attorney, Agent, or Firm* — Rosenberg, Klein & Lee

(57) ABSTRACT

An LED chip package structure with different LED spacing includes a substrate unit, a light-emitting unit, and a package colloid unit. The light-emitting unit has a plurality of LED chips electrically arranged on the substrate unit, and the LEDs are separated from each other by totally different spacing or partially different spacing. For example, the spacings between each two LED chips are from rarefaction to condensation, from condensation to rarefaction, from center rarefaction to outer condensation, from center condensation to outer rarefaction, alternate rarefaction and condensation, or alternate condensation and rarefaction. The package colloid unit covers the LED chips.

22 Claims, 17 Drawing Sheets

LED CHIP PACKAGE STRUCTURE WITH DIFFERENT LED SPACINGS AND A METHOD FOR MAKING THE SAME

BACKGROUND OF THE INVENTION

1. Field of the Invention

The present invention relates to an LED chip package structure and a method for making the same, and particularly relates to an LED chip package structure with different LED spacings and a method for making the same.

2. Description of Related Art

FIG. 1 shows a flowchart of a method for making an LED chip package structure of the prior art. The known method includes: providing a plurality of packaged LEDs that have been packaged (S100); providing a strip substrate body that has a positive electrode trace and a negative electrode trace (S102); and then arranging each packaged LED on the strip substrate body in sequence and electrically connecting a positive electrode and a negative electrode of each packaged LED with the positive electrode trace and the negative electrode trace of the substrate body (S104).

However, with regard to the known first method, each packaged LED needs to be firstly cut from an entire LED package structure, and then each packaged LED is arranged on the strip substrate body via SMT process. Hence, the known first packaging process is time-consuming.

SUMMARY OF THE INVENTION

The present invention provides an LED chip package structure with different LED spacings and a method for making the same. The present invention provides a plurality of LED chips that are separated from each other by totally different spacings or partially different spacings according to user's requirement.

Moreover, because the LED chips are arranged on a substrate body via an adhesive or a hot pressing method, the process for the LED chip package structure is simple and less time is needed for the manufacturing process. Furthermore, the LED chip package structure can be applied to any type of light source such as a back light module, a decorative lamp, a lighting lamp, or a scanner.

A first aspect of the present invention is an LED chip package structure with different LED spacings, including: a substrate unit, a light-emitting unit, and a package colloid unit.

Furthermore, the light-emitting unit has a plurality of LED chips electrically arranged on the substrate unit, and the LED chips are separated from each other by totally different spacings or partially different spacings. The package colloid unit covers the LED chips.

Moreover, the LED chip package structure of the present invention further includes seven embodiments, as follows:

First embodiment: The package colloid unit is a strip fluorescent colloid corresponding to the LED chips.

Second embodiment: The package colloid unit is a strip fluorescent colloid corresponding to the LED chips, and the strip fluorescent colloid has a colloid cambered surface formed on its top surface and a colloid light-exiting surface formed on its front surface. In addition, a frame unit covers the strip fluorescent colloid for exposing the lateral side of the strip fluorescent colloid only.

Third embodiment: The package colloid unit has a plurality of fluorescent colloids corresponding to the LED chips.

Fourth embodiment: The package colloid unit has a plurality of fluorescent colloids corresponding to the LED chips. A frame unit has a plurality of frame layers, and each frame layer is formed around the lateral side of each fluorescent colloid for exposing the top surface of each fluorescent colloid only.

Fifth embodiment: The package colloid unit has a plurality of fluorescent colloids corresponding to the LED chips. A frame unit is formed around the lateral sides of the fluorescent colloids for exposing the top surface of each fluorescent colloid only.

Sixth embodiment: The package colloid unit has a plurality of fluorescent colloids corresponding to the LED chips, and each fluorescent colloid has a colloid cambered surface formed on its top surface and a colloid light-exiting surface formed on its front surface. A frame unit has a plurality of frame layers respectively covering the fluorescent colloids for exposing the lateral sides of the fluorescent colloids only.

Seventh embodiment: The package colloid unit has a plurality of fluorescent colloids corresponding to the LED chips, and each fluorescent colloid has a colloid cambered surface formed on its top surface and a colloid light-exiting surface formed on its front surface. A frame unit covers the fluorescent colloids for exposing the lateral sides of the fluorescent colloids only.

A second aspect of the present invention is a method for making an LED chip package structure with different LED spacings, including: providing a substrate unit; electrically arranging a light-emitting unit on the substrate unit, and the light-emitting unit having a plurality of LED chips that are separated from each other by totally different spacings or partially different spacings; and covering the LED chips with a package colloid unit.

Moreover, the method of the present invention further includes seven embodiments, as follows:

First embodiment: The package colloid unit is a strip fluorescent colloid corresponding to the LED chips.

Second embodiment: The package colloid unit is a strip fluorescent colloid corresponding to the LED chips, and the strip fluorescent colloid has a colloid cambered surface formed on its top surface and a colloid light-exiting surface formed on its front surface. In addition, the method further includes: providing a frame unit that covers the strip fluorescent colloid for exposing the lateral side of the strip fluorescent colloid only.

Third embodiment: The package colloid unit has a plurality of fluorescent colloids corresponding to the LED chips.

Fourth embodiment: The package colloid unit has a plurality of fluorescent colloids corresponding to the LED chips. In addition, the method further includes: providing a frame unit that has a plurality of frame layers, and each frame layer is formed around the lateral side of each fluorescent colloid for exposing the top surface of each fluorescent colloid only.

Fifth embodiment: The package colloid unit has a plurality of fluorescent colloids corresponding to the LED chips. In addition, the method further includes: providing a frame unit that is formed around the lateral sides of the fluorescent colloids for exposing the top surface of each fluorescent colloid only.

Sixth embodiment: The package colloid unit has a plurality of fluorescent colloids corresponding to the LED chips, and each fluorescent colloid has a colloid cambered surface formed on its top surface and a colloid light-exiting surface formed on its front surface. In addition, the method further includes: providing a frame unit that has a plurality of frame layers respectively covering the fluorescent colloids for exposing the lateral sides of the fluorescent colloids only.

Seventh embodiment: The package colloid unit has a plurality of fluorescent colloids corresponding to the LED chips, and each fluorescent colloid has a colloid cambered surface formed on its top surface and a colloid light-exiting surface formed on its front surface. In addition, the method further includes: providing a frame unit that covers the fluorescent colloids for exposing the lateral sides of the fluorescent colloids only.

Furthermore, there are five different arrangements of LED chips, as follows:

First arrangement: The spacings between each two LED chips are from rarefaction to condensation.

Second arrangement: The spacings between each two LED chips are from condensation to rarefaction.

Third arrangement: The spacings between each two LED chips are from center rarefaction to outer condensation.

Fourth arrangement: The spacings between each two LED chips are from center condensation to outer rarefaction.

Fifth arrangement: The spacings between each two LED chips are alternate rarefaction and condensation.

Sixth arrangement: The spacings between each two LED chips are alternate condensation and rarefaction.

Therefore, because the LED chips are arranged on a substrate body via an adhesive or a hot pressing method, the process for the LED chip package structure is simple and less time is needed for the manufacturing process.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF PREFERRED EMBODIMENTS

FIGS. 2A-2E show five schematic views of five different arrangements of LED chips according to the present invention, respectively.

Figure 1:
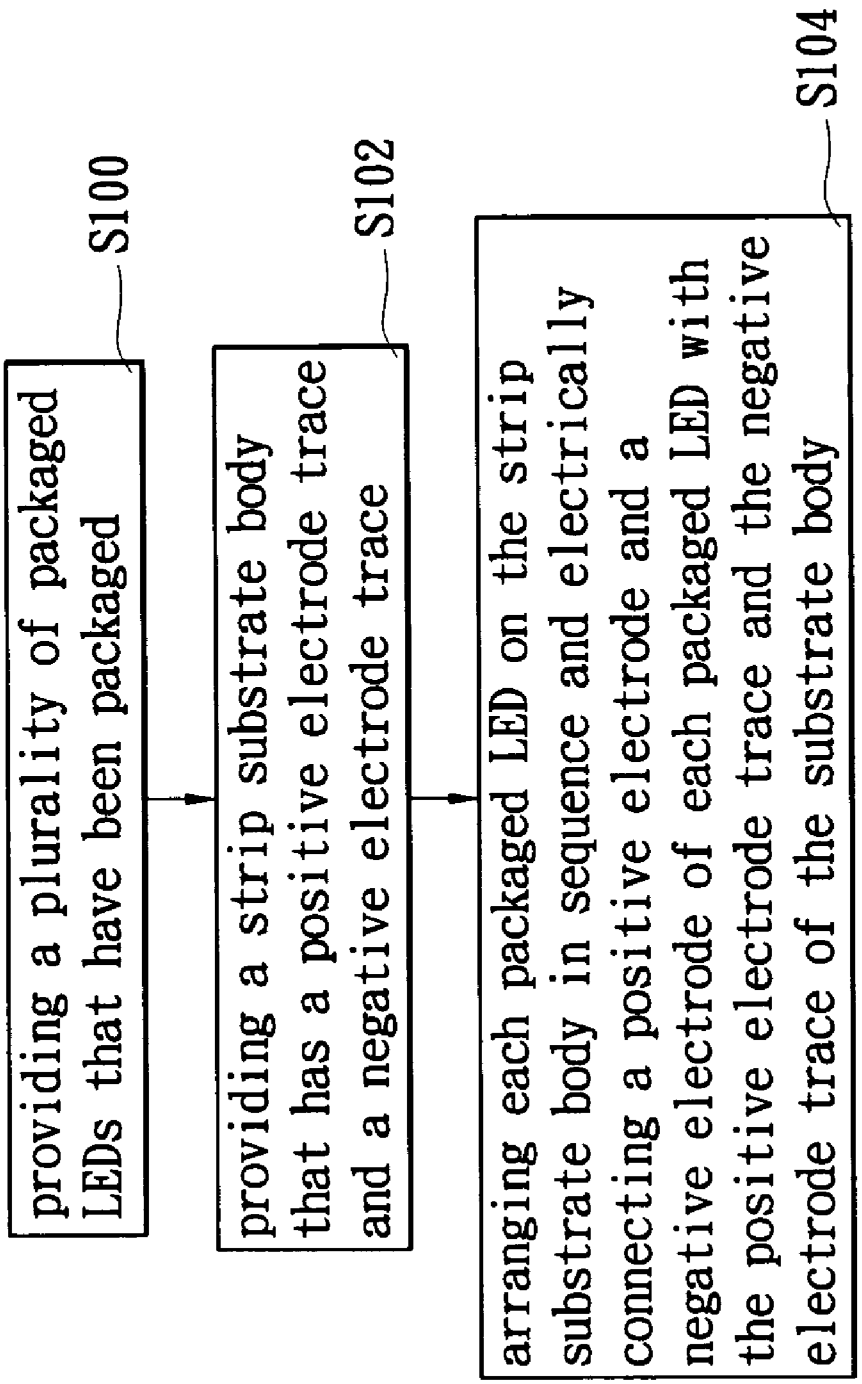
FIG. 1 PRIOR ART
FIG. 1 is a flowchart of a method for making an LED chip package structure of the prior art.
Figure 2A:
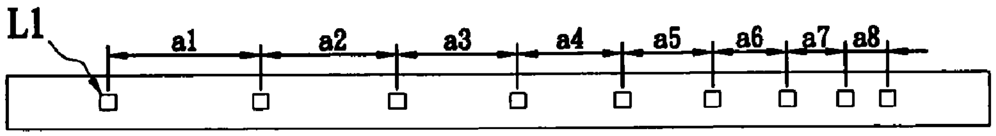
FIG. 2A is a schematic view of a first arrangement of LED chips according to the present invention.

Referring to FIG. 2A, there are many different spacings (a1, a2, a3, a4, a5, a6, a7, a8) between each two LED chips L1 are from rarefaction to condensation. Hence, the spacings (a1, a2, a3, a4, a5, a6, a7, a8) are from large to small such as a1>a2>a3>a4>a5>a6>a7>a8.

Figure 2B:
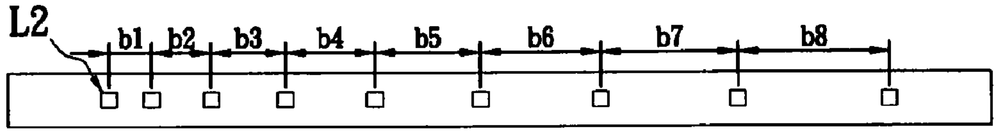
FIG. 2B is a schematic view of a second arrangement of LED chips according to the present invention.

Referring to FIG. 2B, there are many different spacings (b1, b2, b3, b4, b5, b6, b7, b8) between each two LED chips L2 are from condensation to rarefaction. Hence, the spacings (b1, b2, b3, b4, b5, b6, b7, b8) are from small to large such as b1<b2<b3<b4<b5<b6<b7<b8.

Figure 2C:
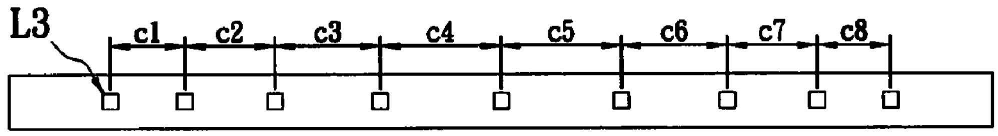
FIG. 2C is a schematic view of a third arrangement of LED chips according to the present invention.

Referring to FIG. 2C, there are many different spacings (c1, c2, c3, c4, c5, c6, c7, c8) between each two LED chips L3 are from center rarefaction to outer condensation. Hence, the spacings (c1, c2, c3, c4, c5, c6, c7, c8) are from center large to outer small such as c4=c5>c3=c6>c2=c7>c1=c8.

Figure 2D:
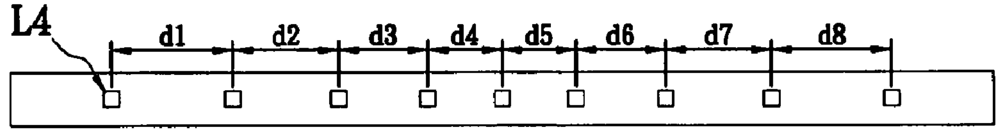
FIG. 2D is a schematic view of a fourth arrangement of LED chips according to the present invention.

Referring to FIG. 2D, there are many different spacings (d1, d2, d3, d4, d5, d6, d7, d8) between each two LED chips L4 are from center condensation to outer rarefaction. Hence, the spacings (d1, d2, d3, d4, d5, d6, d7, d8) are from center small to outer large such as c4=c5<c3=c6<c2=c7<c1=c8.

Figure 2E:
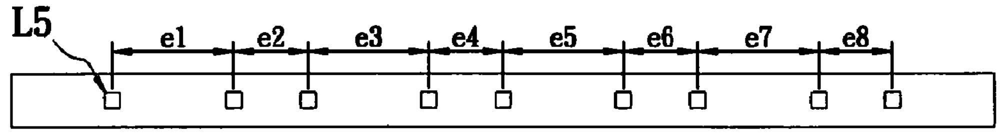
FIG. 2E is a schematic view of a fifth arrangement of LED chips according to the present invention.

Referring to FIG. 2E, there are many different spacings (e1, e2, e3, e4, e5, e6, e7, e8) between each two LED chips L5 are alternate rarefaction and condensation. Hence, the spacings (e1, e2, e3, e4, e5, e6, e7, e8) are alternate large and small such as e1=e3=e5=e7>e2=e4=e6=e8.

Figure 2F:
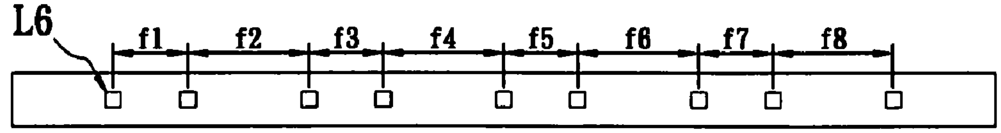
FIG. 2F is a schematic view of a sixth arrangement of LED chips according to the present invention.

Referring to FIG. 2F, there are many different spacings (f1, f2, f3, f4, f5, f6, f7, f8) between each two LED chips L6 are alternate condensation and rarefaction. Hence, the spacings (f1, f2, f3, f4, f5, f6, f7, f8) are alternate small and large such as f1=f3=f5=f7<f2=f4=f6=f8.

Although above-mentioned LED chips are arranged by a COB (Chip On Board) process, it should not be used to limit the present invention. Any arrangement method is protected under the claims of the present invention, such as SMD (Surface Mounted Device).

Figure 3:
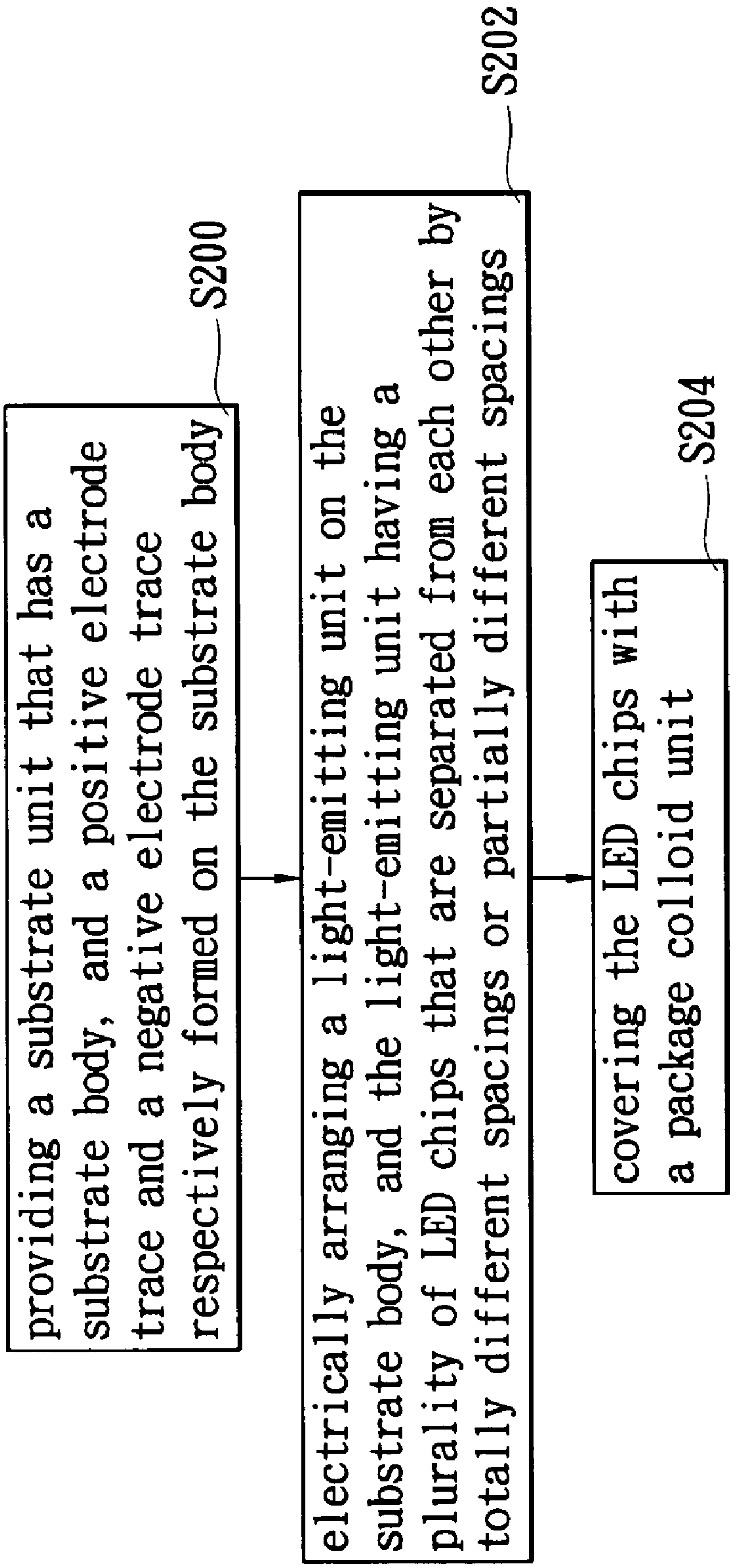
FIG. 3 is a flowchart of a method of making an LED chip package structure with different LED spacings according to the first embodiment of present invention.
Figure 3A:
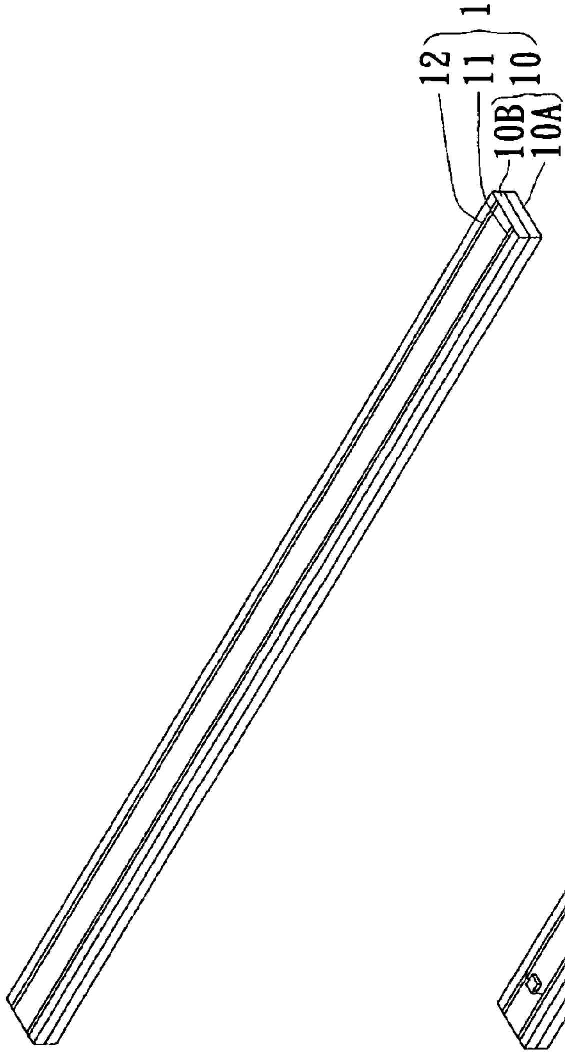
FIGS. 3A to 3C are schematic diagrams of an LED chip package structure with different LED spacings according to the first embodiment of the present invention, at different stages of the packaging processes, respectively.

Next, following LED chip package structure of the present invention has seven embodiments using the first arrangement of LED chips in FIG. 2A, as follow:

Referring to FIGS. 3, 3A to 3C and 3D, the first embodiment provides a method for making an LED chip package structure with different LED spacings, including as follows:

Step S200 is: referring to FIGS. 3 and 3A, providing a substrate unit 1 that has a substrate body 10, and a positive electrode trace 11 and a negative electrode trace 12 respectively formed on the substrate body 10.

Moreover, the substrate unit 1 can be a PCB (Printed Circuit Board), a flexible substrate, an aluminum substrate, a ceramic substrate, or a copper substrate according to user's requirement. In addition, the substrate body 10 has a metal layer 10A and a bakelite layer 10B formed on the metal layer 10A. Both the positive electrode trace 11 and the negative electrode trace 12 can be aluminum circuits or silver circuits.

Figure 3B:
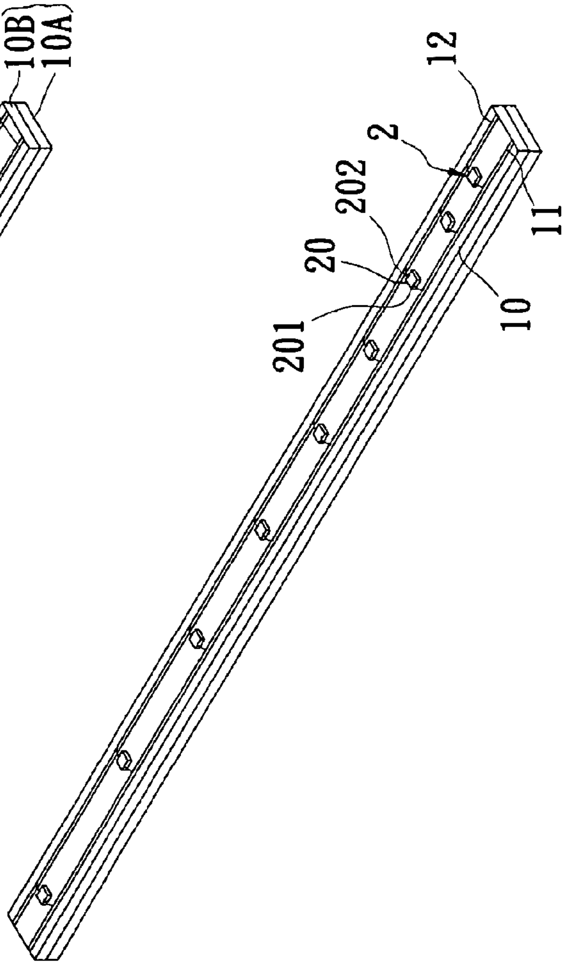

Step S202 is: referring to FIGS. 3 and 3B, electrically arranging a light-emitting unit 2 on the substrate body 10, and the light-emitting unit 2 having a plurality of LED chips 20 that are separated from each other by totally different spacings or partially different spacings. Furthermore, each LED chip 20 has a positive electrode 201 and a negative electrode 202 respectively and electrically connected with the positive electrode trace 11 and the negative electrode trace 12 of the substrate unit 1.

Figure 3C:
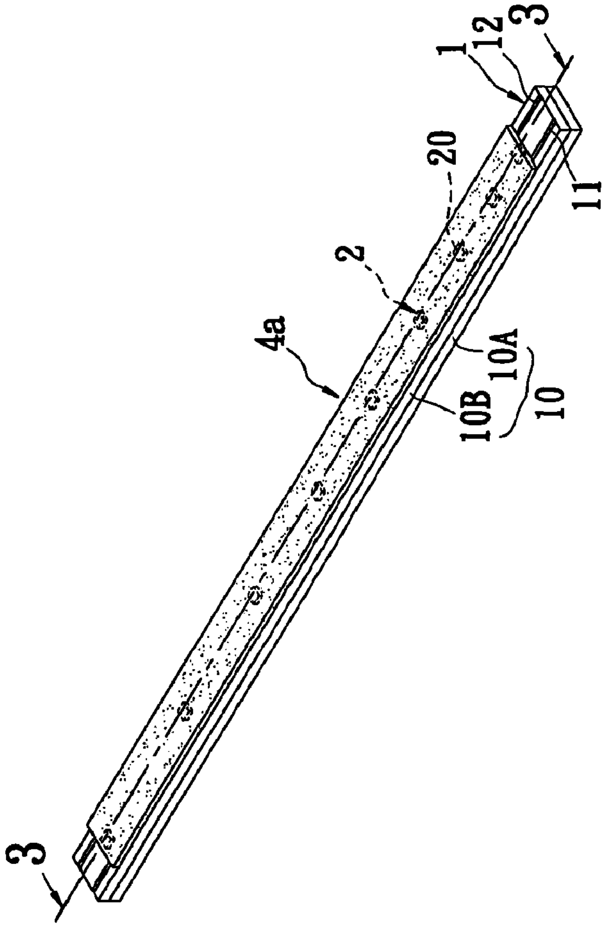
Figure 3D:
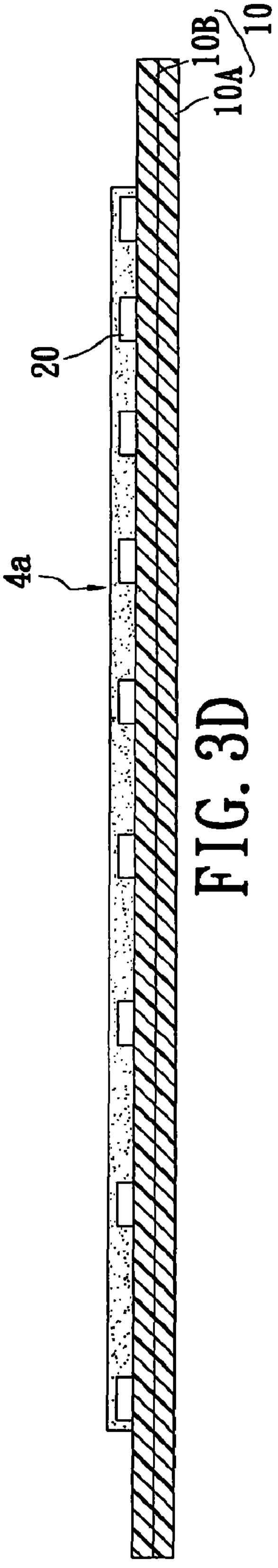
FIG. 3D is a cross-sectional view along line 3D-3D in FIG. 3C.

Step S204 is: referring to FIGS. 3, 3C and 3D, covering the LED chips 20 with a package colloid unit 4*a*. In addition, the package colloid unit 4*a* is a strip fluorescent colloid corresponding to the LED chips 20. The strip fluorescent colloid is formed by mixing silicon and fluorescent powders or mixing epoxy and fluorescent powders.

Referring to FIGS. 4, 4A to 4B and 4C, the steps from S300 to S302 of the second embodiment are same as the steps from S200 to S202 of the first embodiment. In other words, the illustration of S300 is the same as FIG. 3A of the first embodiment, and the illustration of S302 is the same as FIG. 3B of the first embodiment.

Figure 4:
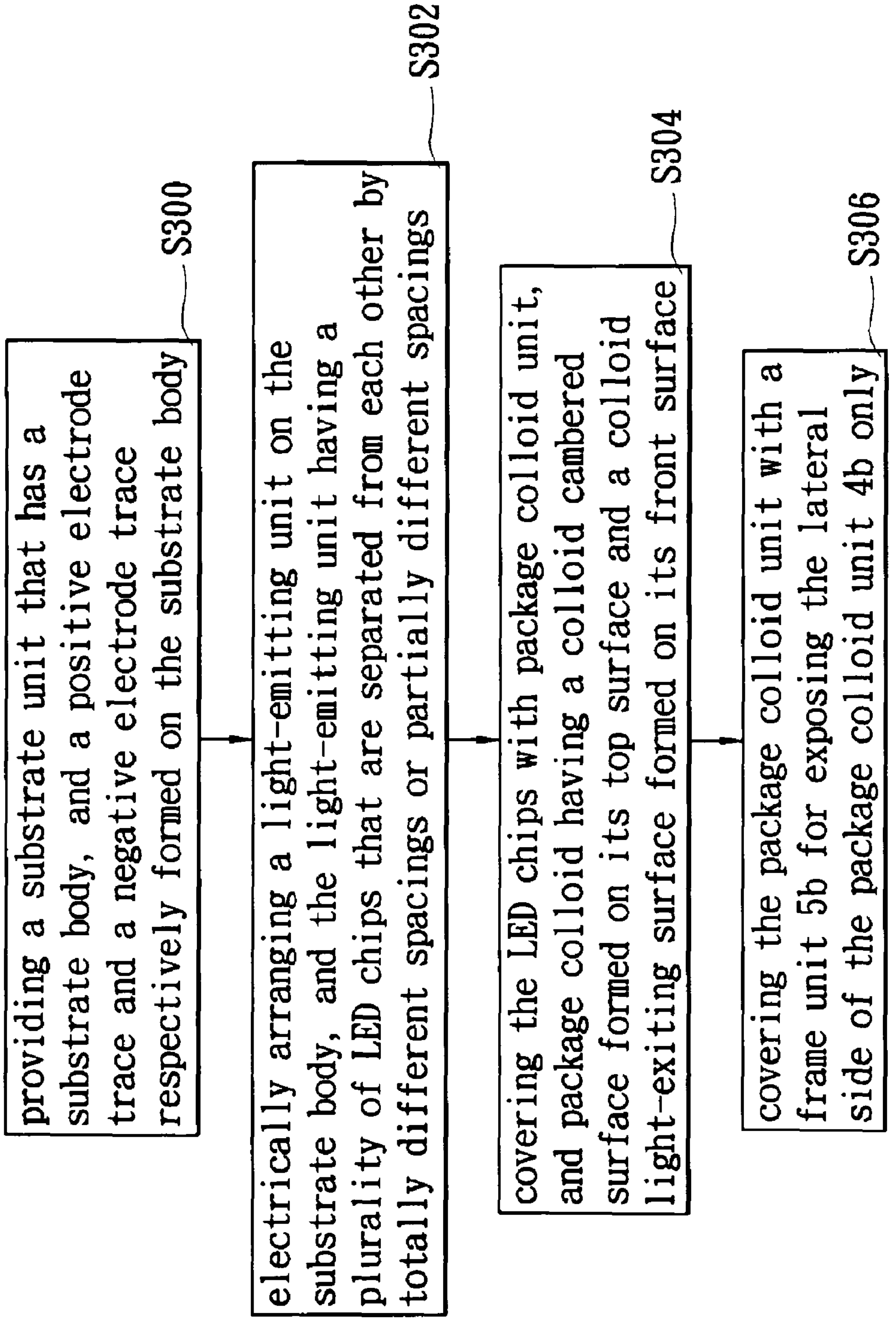
FIG. 4 is a flowchart of a method of making an LED chip package structure with different LED spacings according to the second embodiment of present invention.
Figure 4B:
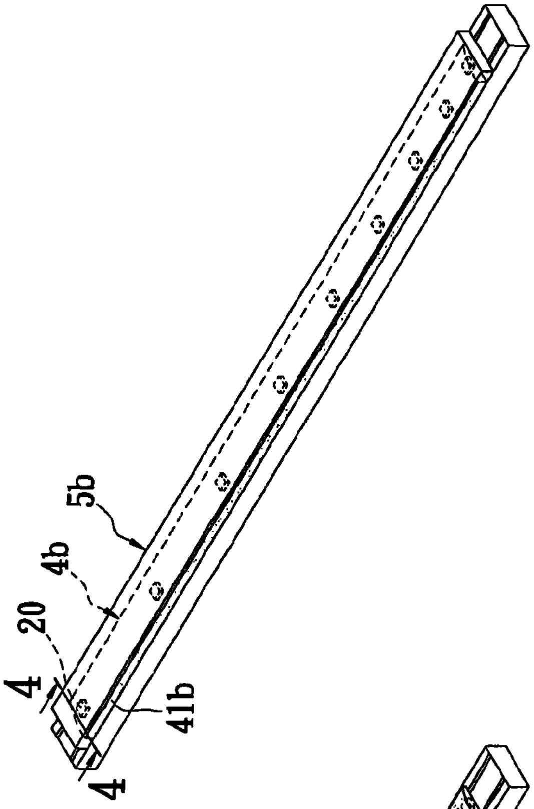
FIGS. 4A to 4B are schematic diagrams of an LED chip package structure with different LED spacings according to the second embodiment of the present invention, at different partial stages of the packaging processes, respectively.
Figure 4A:
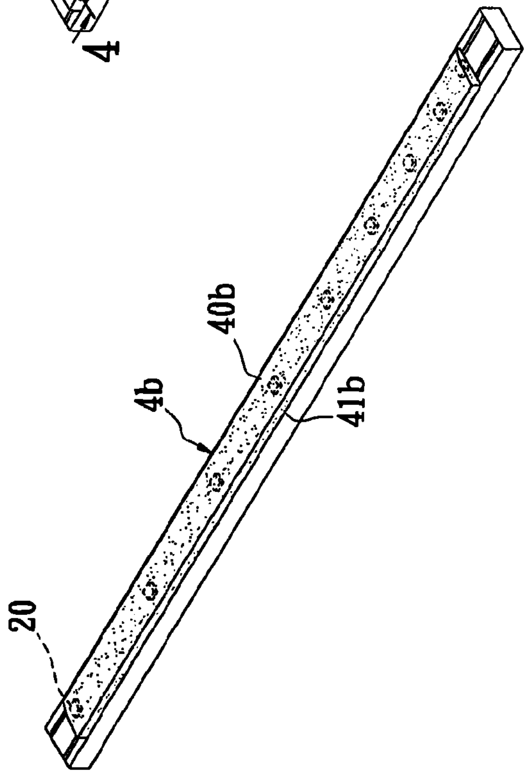

Step S304 is: referring to FIGS. 4 and 4A, after the step of S302, the method of the second embodiment further includes: covering the LED chips 20 with package colloid unit 4*b*, and package colloid 4*b* having a colloid cambered surface 40*b* formed on its top surface and a colloid light-exiting surface 41*b* formed on its front surface. In addition, the package colloid unit 4*b* is a strip fluorescent colloid corresponding to the LED chips 20. Therefore, the strip fluorescent colloid has the colloid cambered surface 40*b* formed on its top surface and the colloid light-exiting surface 41*b* formed on its front surface.

Figure 4C:
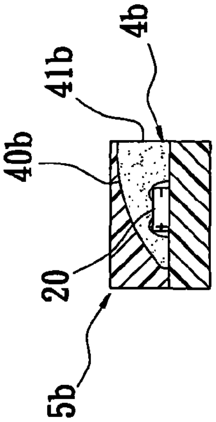
FIG. 4C is a cross-sectional view along line 4C-4C in FIG. 4B.

Step S306 is: referring to FIGS. 4, 4B and 4C, covering the package colloid unit 4*b* (the strip fluorescent colloid) with a frame unit 5*b* for exposing the lateral side (the colloid light-exiting surface 41*b*) of the package colloid unit 4*b* (the strip fluorescent colloid) only. In addition, the frame unit 5*b* can be an opaque frame layer.

Figure 5:
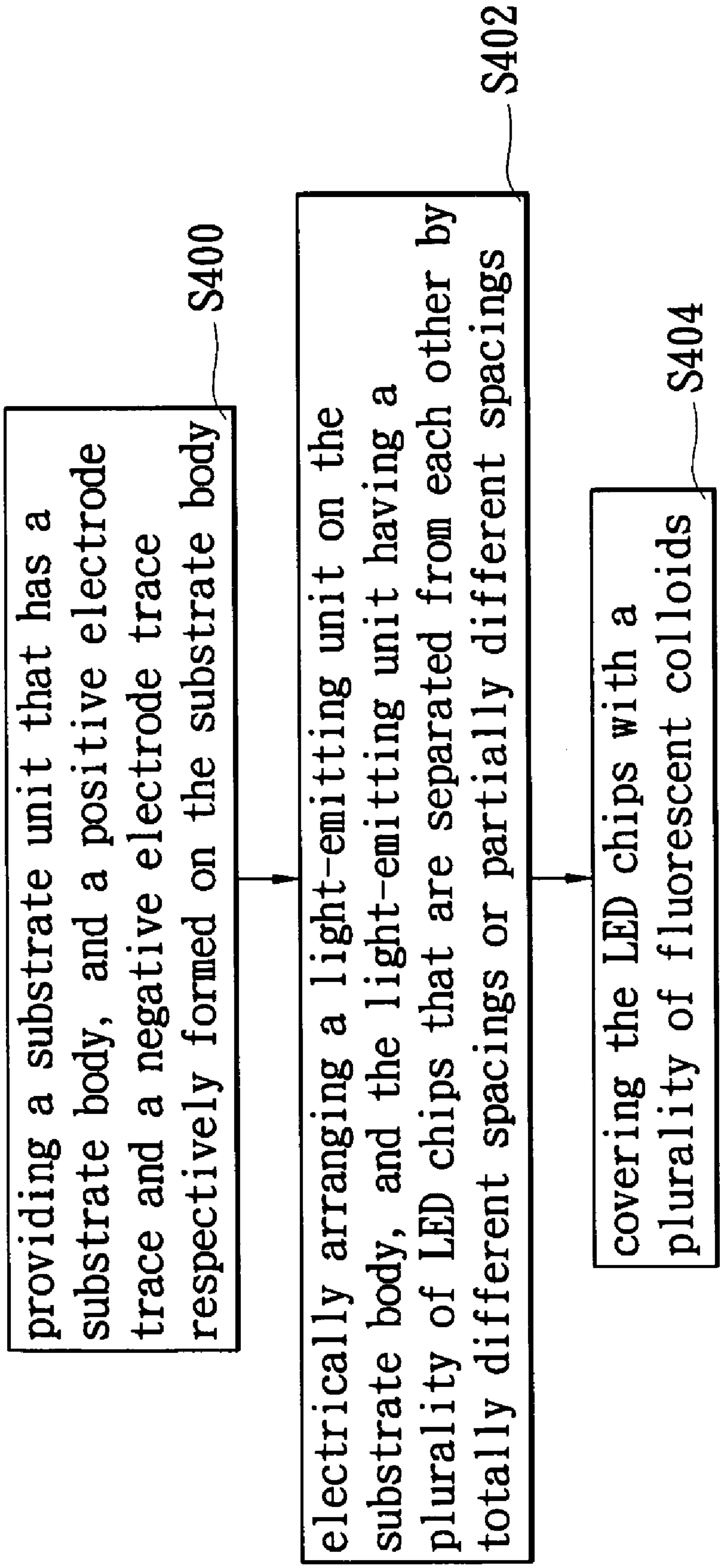
FIG. 5 is a flowchart of a method of making an LED chip package structure with different LED spacings according to the third embodiment of present invention.
Figure 5A:
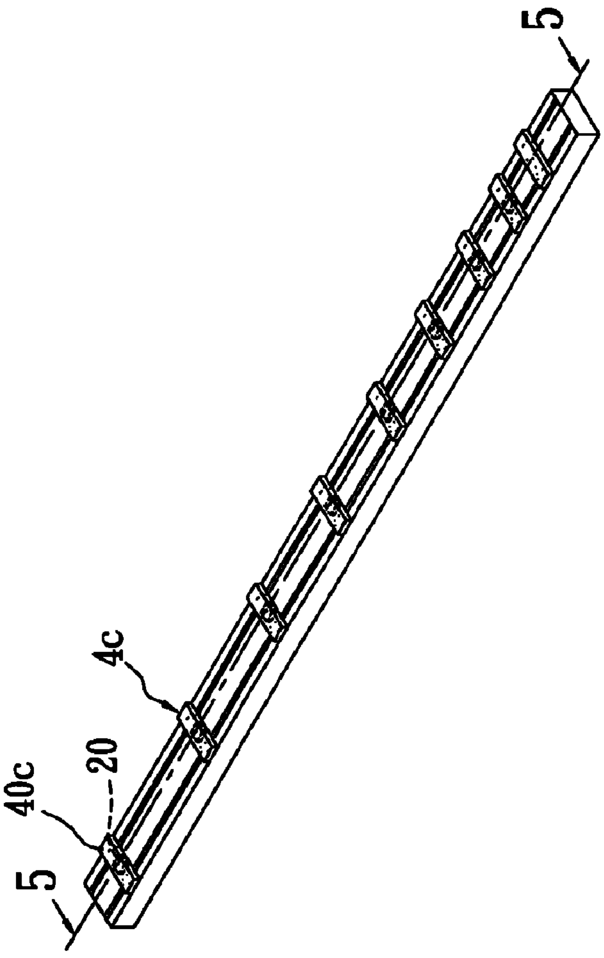
FIG. 5A is a schematic diagram of an LED chip package structure with different LED spacings according to the third embodiment of the present invention.
Figure 5B:
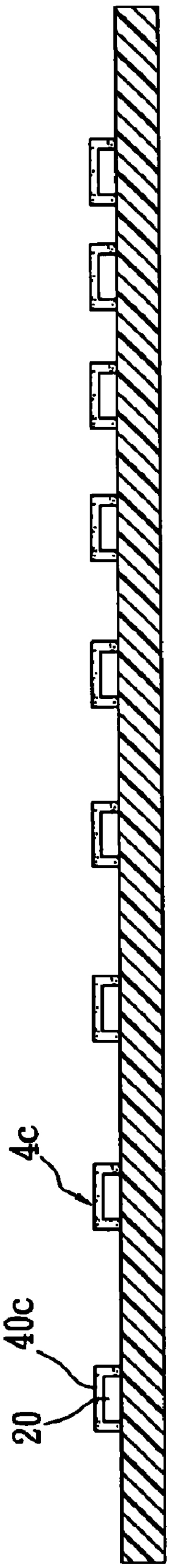
FIG. 5B is a cross-sectional view along line 5B-5B in FIG. 5A.

Referring to FIGS. 5 and 5A to 5B, the steps from S400 to S402 of the third embodiment are same as the steps from S200 to S202 of the first embodiment. In other words, the illustration of S400 is the same as FIG. 3A of the first embodiment, and the illustration of S402 is the same as FIG. 3B of the first embodiment. In addition, referring to FIGS. 5A and 5B, after the step of S402, the method of the third embodiment further includes: covering the LED chips 20 with a plurality of fluorescent colloids 40*c* (S404). The fluorescent colloids 40*c* are combined to form a package colloid unit 4*c*, and each fluorescent colloid 40*c* is formed by mixing silicon and fluorescent powders or mixing epoxy and fluorescent powders.

Referring to FIGS. 6, 6A to 6B and 6C, the steps from S500 to S502 of the fourth embodiment are same as the steps from S200 to S202 of the first embodiment. In other words, the illustration of S500 is the same as FIG. 3A of the first embodiment, and the illustration of S502 is the same as FIG. 3B of the first embodiment.

Figure 6:
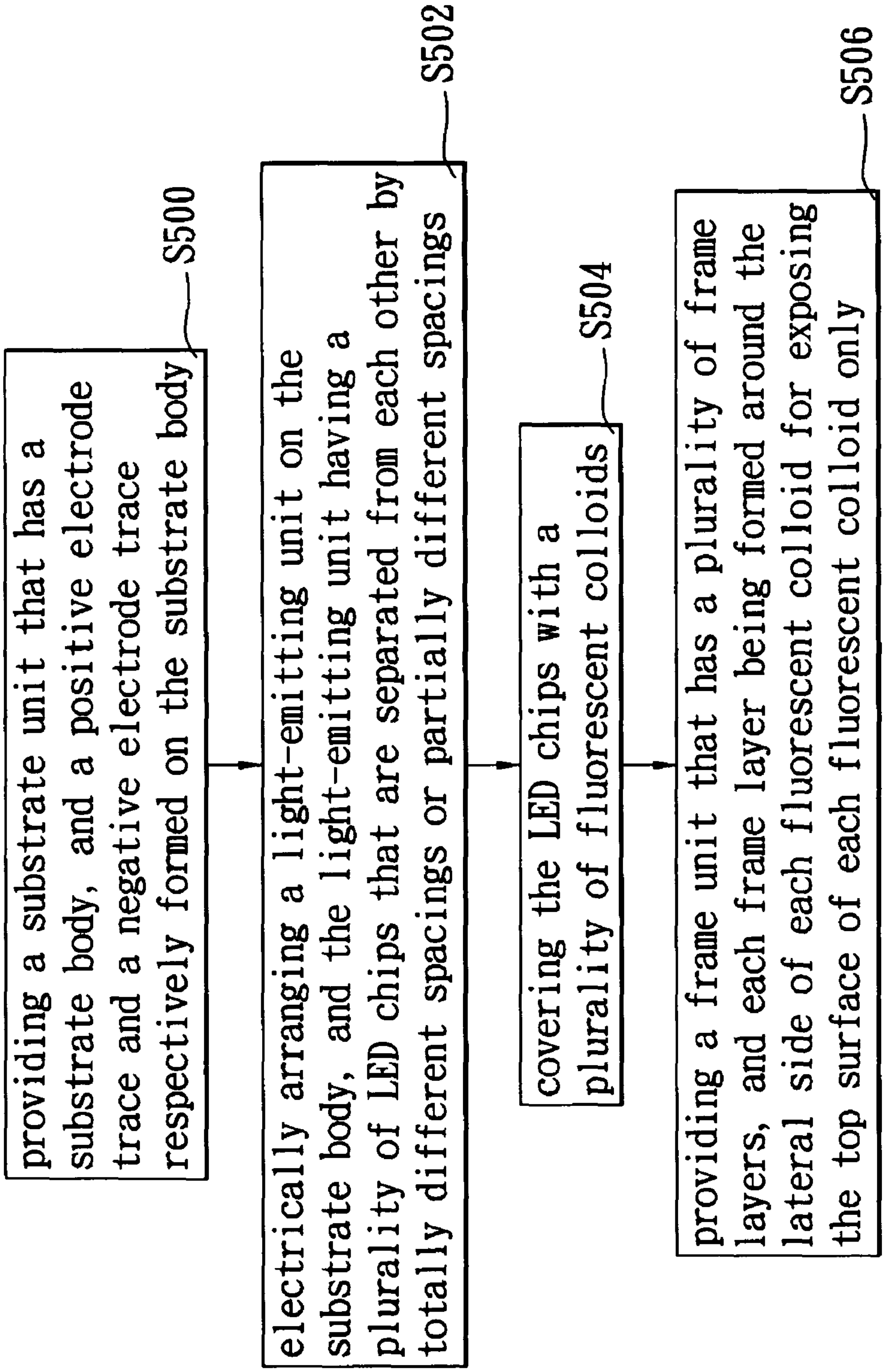
FIG. 6 is a flowchart of a method of making an LED chip package structure with different LED spacings according to the fourth embodiment of present invention.
Figure 6B:
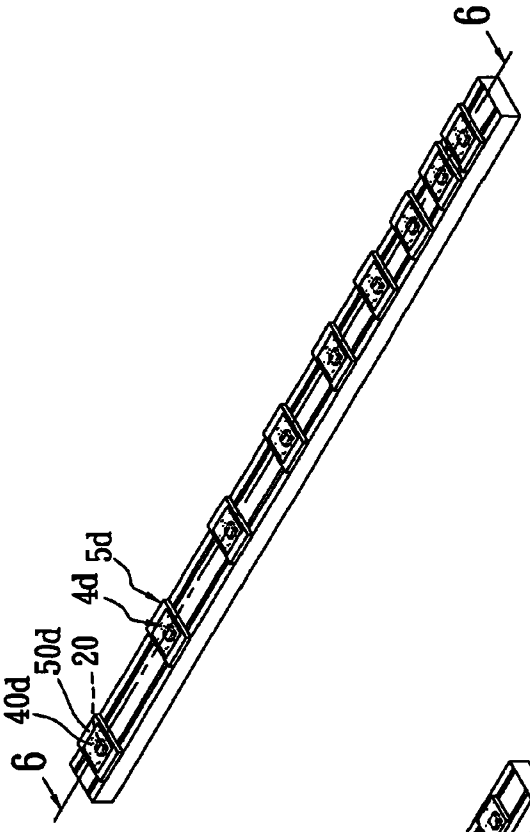
FIGS. 6A to 6B are schematic diagrams of an LED chip package structure with different LED spacings according to the fourth embodiment of the present invention, at different partial stages of the packaging processes, respectively.
Figure 6A:
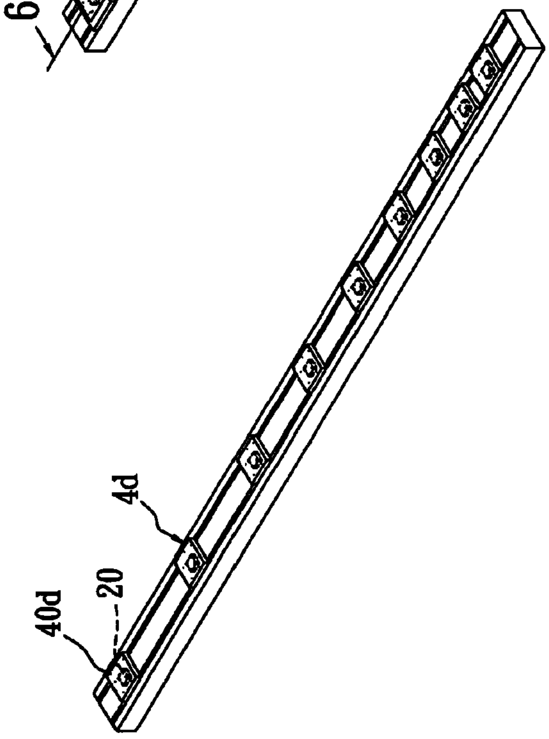
Figure 6C:
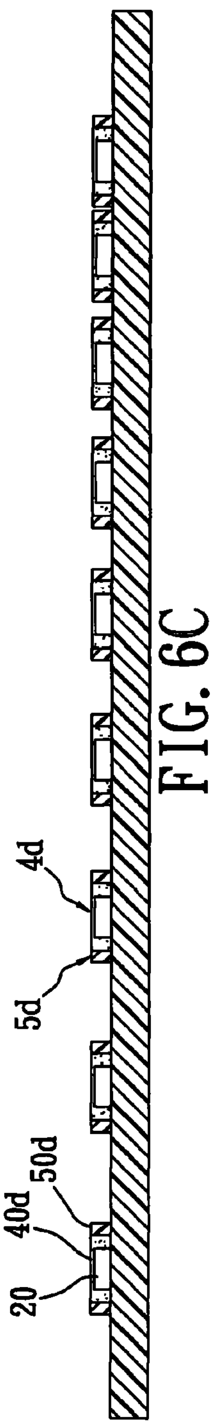
FIG. 6C is a cross-sectional view along line 6C-6C in FIG. 6B.

Moreover, referring to FIGS. 6, 6A and 6B, after the step of S502, the method of the fourth embodiment further includes: covering the LED chips 20 with a plurality of fluorescent colloids 40*d* (S504), and then providing a frame unit 5*d* that has a plurality of frame layers 50*d*, and each frame layer 50*d* being formed around the lateral side of each fluorescent colloid 40*d* for exposing the top surface of each fluorescent colloid 40*d* only (S506). In addition, the fluorescent colloids 40*d* are combined to form a package colloid unit 4*d*, and the frame layers 50*d* are a plurality of opaque frame layers.

Referring to FIGS. 7, 7A to 7B and 7C, the steps from S600 to S602 of the fifth embodiment are same as the steps from S200 to S202 of the first embodiment. In other words, the illustration of S600 is the same as FIG. 3A of the first embodiment, and the illustration of S602 is the same as FIG. 3B of the first embodiment.

Figure 7:
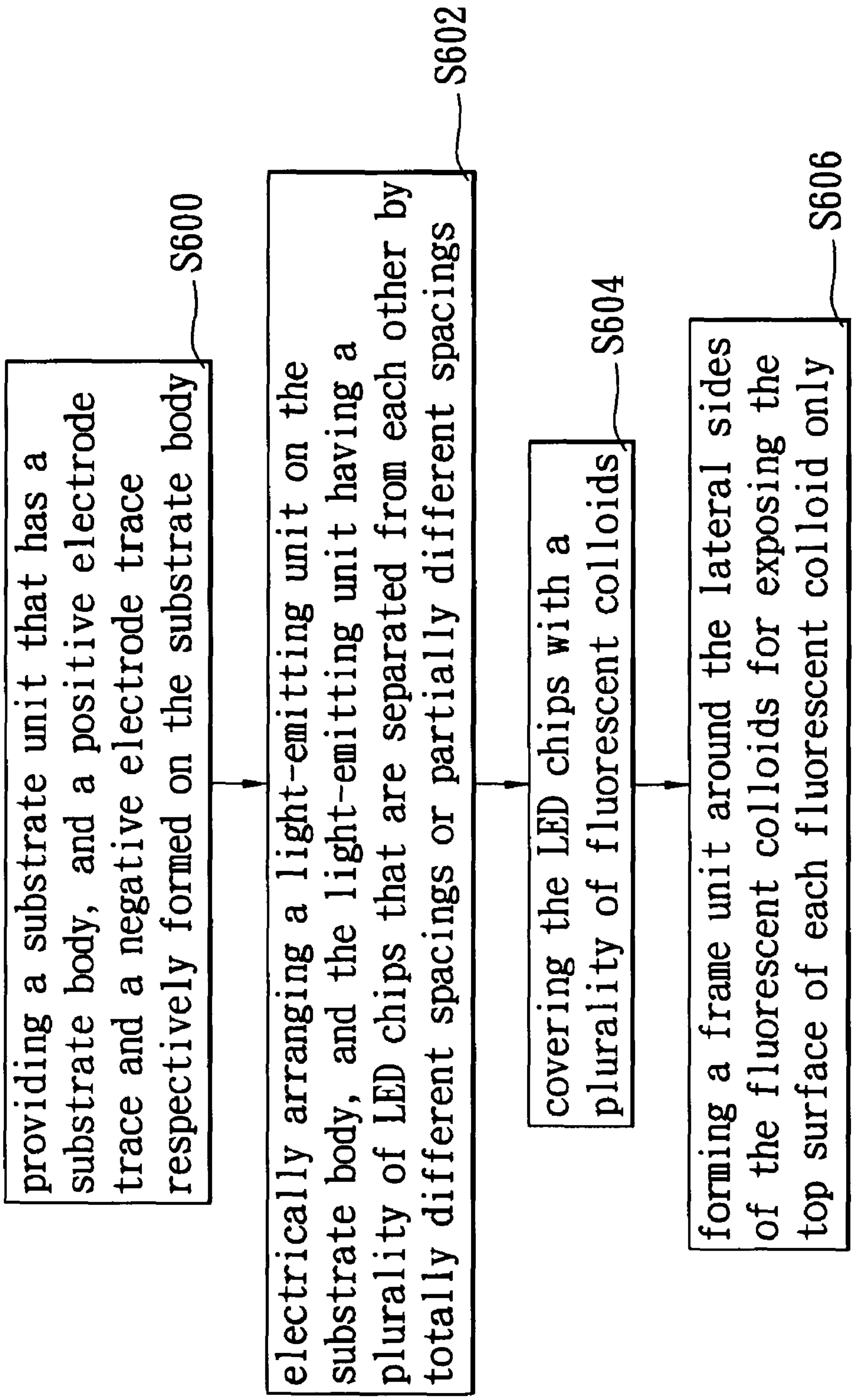
FIG. 7 is a flowchart of a method of making an LED chip package structure with different LED spacings according to the fifth embodiment of present invention.
Figure 7B:
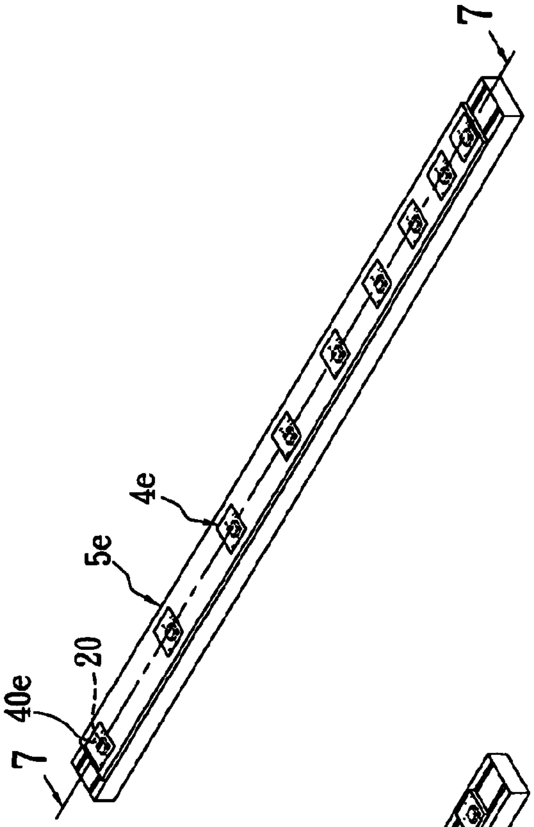
FIGS. 7A to 7B are schematic diagrams of an LED chip package structure with different LED spacings according to the fifth embodiment of the present invention, at different partial stages of the packaging processes, respectively.
Figure 7A:
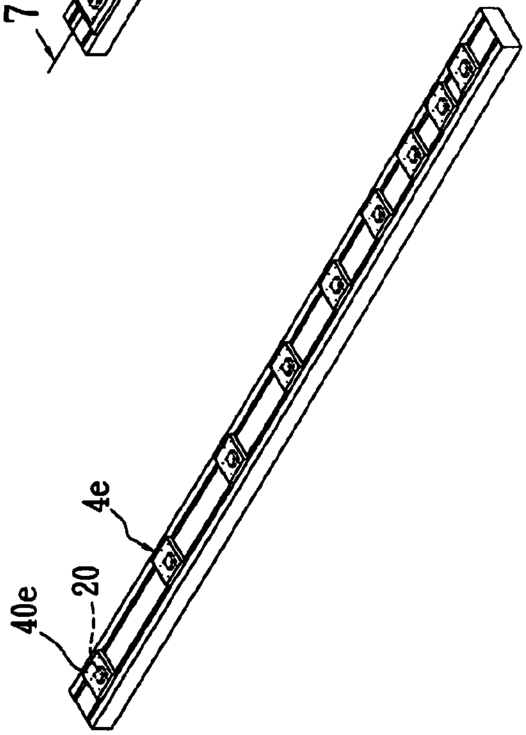
Figure 7C:
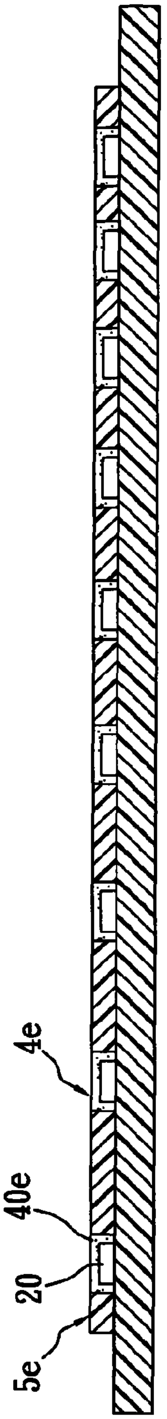
FIG. 7C is a cross-sectional view along line 7C-7C in FIG. 7B.

Moreover, referring to FIGS. 7, 7A and 7B, after the step of S602, the method of the fifth embodiment further includes: covering the LED chips 20 with a plurality of fluorescent colloids 40*e* (S604), and then forming a frame unit 5*e* around the lateral sides of the fluorescent colloids 40*e* for exposing the top surface of each fluorescent colloid 40*e* only. In addition, the fluorescent colloids 40*e* are combined to form a package colloid unit 4*e*, and the frame unit 5*e* is an opaque frame layer.

Referring to FIGS. 8, 8A to 8B and 8C, the steps from S700 to S702 of the sixth embodiment are same as the steps from S200 to S202 of the first embodiment. In other words, the illustration of S700 is the same as FIG. 3A of the first embodiment, and the illustration of S702 is the same as FIG. 3B of the first embodiment.

Figure 8:
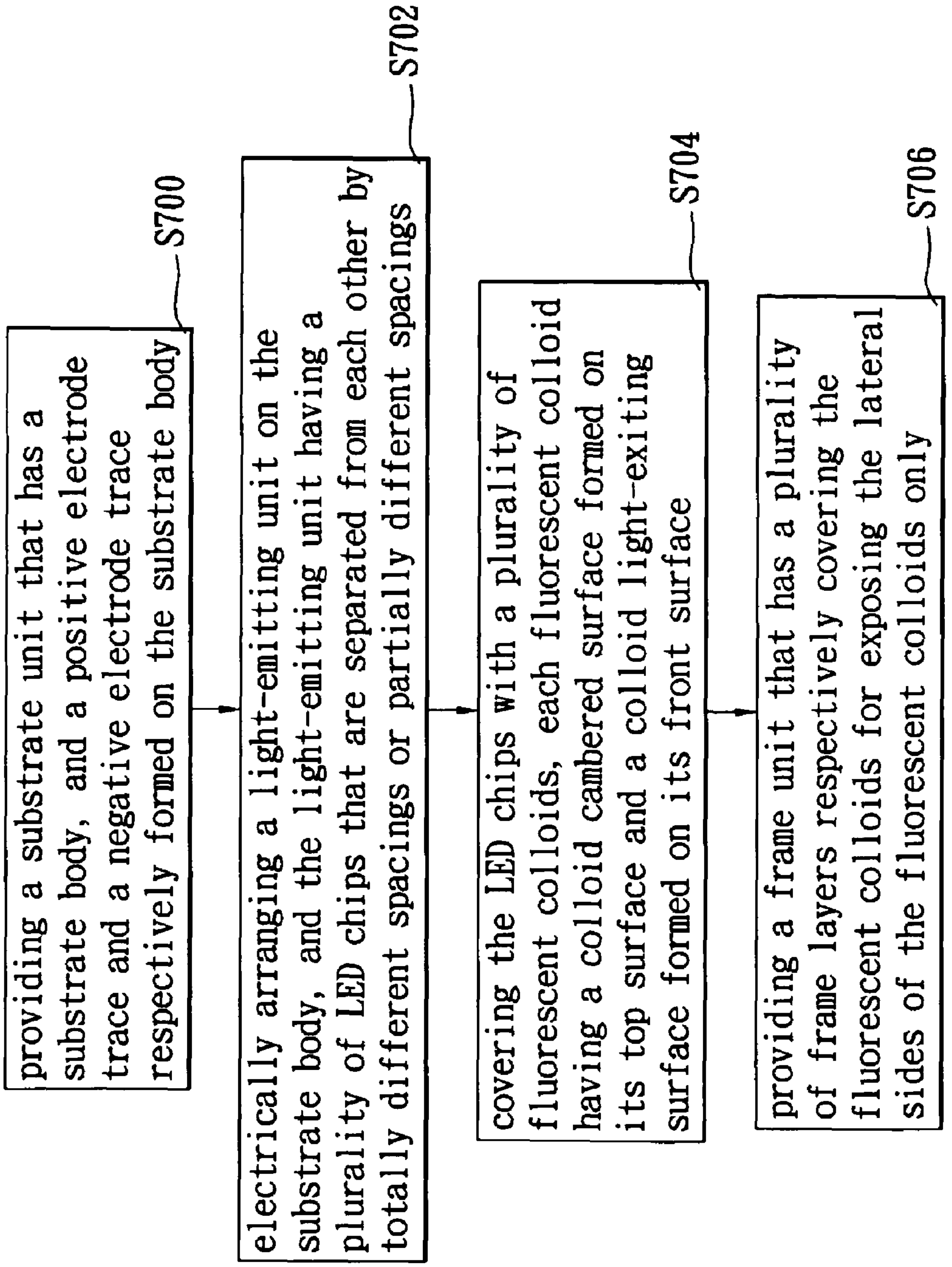
FIG. 8 is a flowchart of a method of making an LED chip package structure with different LED spacings according to the sixth embodiment of present invention.
Figure 8A:
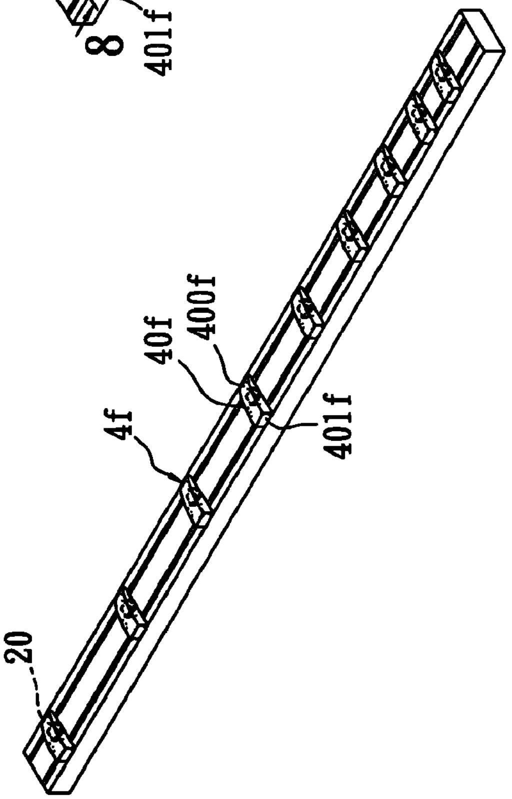
FIGS. 8A to 8B are schematic diagrams of an LED chip package structure with different LED spacings according to the sixth embodiment of the present invention, at different partial stages of the packaging processes, respectively.

Moreover, referring to FIGS. 8 and 8A, after the step of S702, the method of the sixth embodiment further includes: covering the LED chips 20 with a plurality of fluorescent colloids 40*f*, each fluorescent colloid 40*f* having a colloid cambered surface 400*f* formed on its top surface and a colloid light-exiting surface 401*f* formed on its front surface (S704). In addition, the fluorescent colloids 40*f* are combined to form a package colloid unit 4*f*.

Figure 8B:
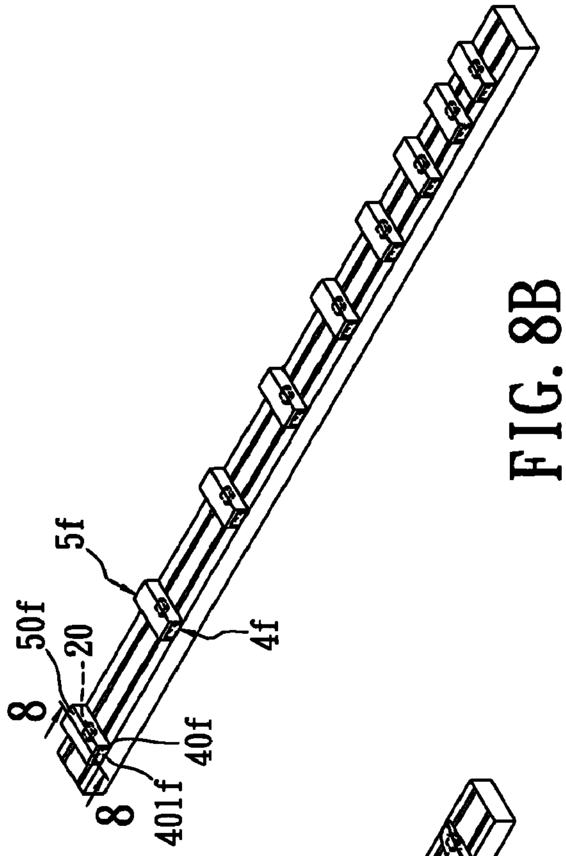
Figure 8C:
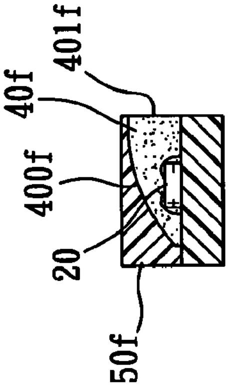
FIG. 8C is a cross-sectional view along line 8C-8C in FIG. 8B.

Referring to FIGS. 8, 8B and 8C, after the step of S704, the method of the sixth embodiment further includes: providing a frame unit 5*f* that has a plurality of frame layers 50*f* respectively covering the fluorescent colloids 40*f* for exposing the lateral sides of the fluorescent colloids 40*f* only (S706). In addition, the frame layers 50*f* are a plurality of opaque frame layers.

Referring to FIGS. 9, 9A to 9B and 9C, the steps from S800 to S802 of the seventh embodiment are same as the steps from S200 to S202 of the first embodiment. In other words, the illustration of S800 is the same as FIG. 3A of the first embodiment, and the illustration of S802 is the same as FIG. 3B of the first embodiment.

Figure 9:
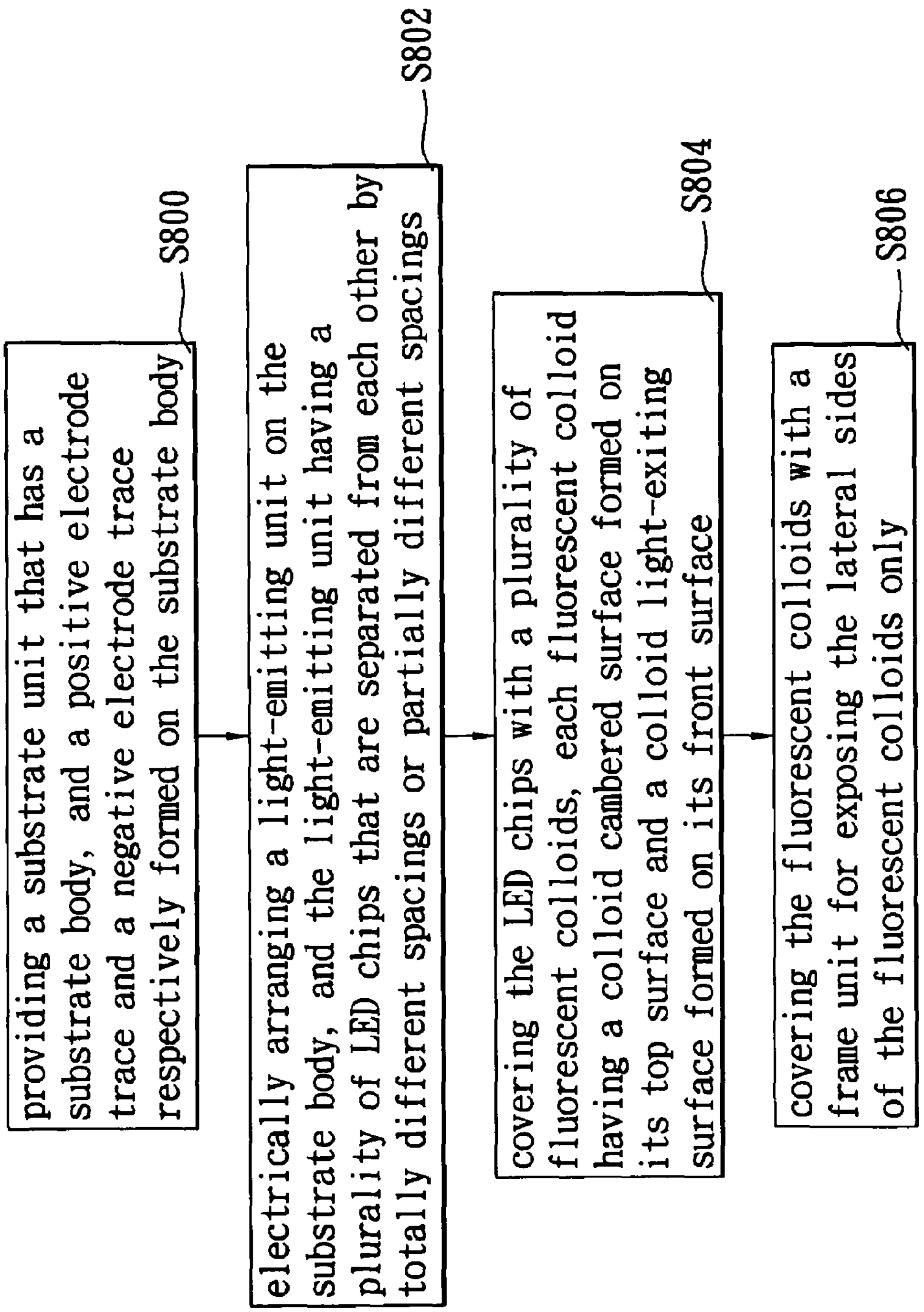
FIG. 9 is a flowchart of a method of making an LED chip package structure with different LED spacings according to the seventh embodiment of present invention.
Figure 9A:
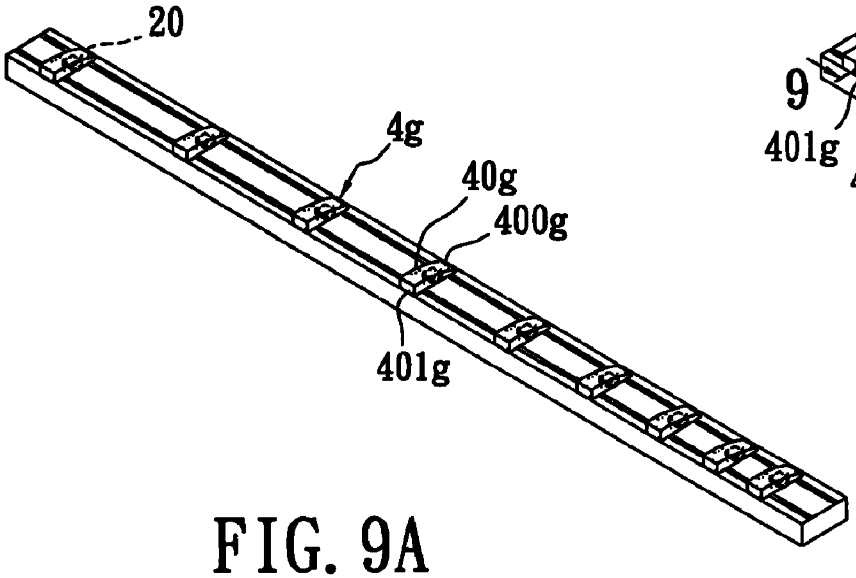
FIGS. 9A to 9B are schematic diagrams of an LED chip package structure with different LED spacings according to the seventh embodiment of the present invention, at different partial stages of the packaging processes, respectively.

Moreover, referring to FIGS. 9 and 9A, after the step of S802, the method of the seventh embodiment further includes: covering the LED chips 20 with a plurality of fluorescent colloids 40*g*, each fluorescent colloid 40*g* having a colloid cambered surface 400*g* formed on its top surface and a colloid light-exiting surface 401*g* formed on its front surface (S804). In addition, the fluorescent colloids 40*g* are combined to form a package colloid unit 4*g*.

Figure 9B:
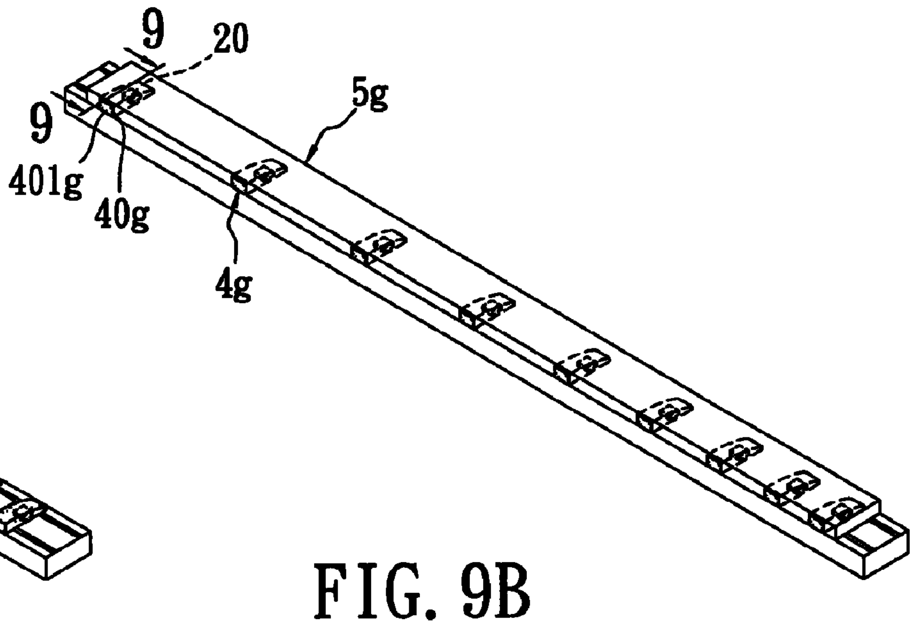
Figure 9C:
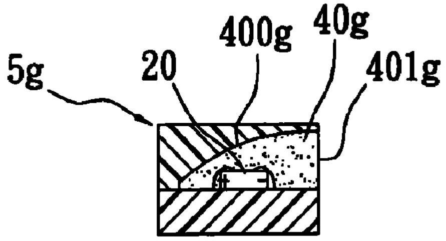
FIG. 9C is a cross-sectional view along line 9C-9C in FIG. 9B.

Referring to FIGS. 9, 9B and 9C, after the step of S804, the method of the seventh embodiment further includes: covering the fluorescent colloids 40*g* with a frame unit 5*g* for exposing the lateral sides of the fluorescent colloids 40*g* only (S806). In addition, the frame unit 5*g* is an opaque frame layer.

In conclusion, the present invention provides a plurality of LED chips that are separated from each other by totally different spacings or partially different spacings according to user's requirement.

Moreover, because the LED chips are arranged on a substrate body via an adhesive or a hot pressing method, the process for the LED chip package structure is simple and less time is needed for the manufacturing process. Furthermore, the LED chip package structure can be applied to any type of light source such as a back light module, a decorative lamp, a lighting lamp, or a scanner.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A LED chip package structure with different LED spacings, comprising:

a substrate unit;

a light-emitting unit having a plurality of LED chips electrically arranged on the substrate unit, wherein the LED chips are separated from each other by different spacings; and a package colloid unit covering the LED chips, wherein the package colloid unit has a plurality of fluorescent colloids corresponding to the LED chips.

2. The LED chip package structure as claimed in claim 1, wherein the substrate unit is a PCB (Printed Circuit Board), a flexible substrate, an aluminum substrate, a ceramic substrate, or a copper substrate.

3. The LED chip package structure as claimed in claim 1, wherein the substrate unit has a substrate body, and a positive electrode trace and a negative electrode trace respectively formed on the substrate body.

4. The LED chip package structure as claimed in claim 3, wherein the substrate body has a metal layer and a bakelite layer formed on the metal layer.

5. The LED chip package structure as claimed in claim 3, wherein both the positive electrode trace and the negative electrode trace are aluminum circuits or silver circuits.

6. The LED chip package structure as claimed in claim 3, wherein each LED chip has a positive electrode and a negative electrode respectively and electrically connected with the positive electrode trace and the negative electrode trace of the substrate unit.

7. The LED chip package structure as claimed in claim 1, wherein the spacings between each two LED chips are from rarefaction to condensation.

8. The LED chip package structure as claimed in claim 1, wherein the spacings between each two LED chips are from condensation to rarefaction.

9. The LED chip package structure as claimed in claim 1, wherein the spacings between each two LED chips are from center rarefaction to outer condensation.

10. The LED chip package structure as claimed in claim 1, wherein the spacings between each two LED chips are from center condensation to outer rarefaction.

11. The LED chip package structure as claimed in claim 1, wherein the spacings between each two LED chips are alternate rarefaction and condensation, or alternate condensation and rarefaction.

12. The LED chip package structure as claimed in claim 1, wherein each fluorescent colloid is formed by mixing silicon and fluorescent powders or mixing epoxy and fluorescent powders.

13. The LED chip package structure as claimed in claim 1, further comprising a frame unit that has a plurality of frame layers, wherein each frame layer is formed around the lateral side of each fluorescent colloid for exposing the top surface of each fluorescent colloid only, and the frame layers are a plurality of opaque frame layers.

14. The LED chip package structure as claimed in claim 1, further comprising a frame unit formed around the lateral sides of the fluorescent colloids for exposing the top surface of each fluorescent colloid only, and the frame unit is an opaque frame layer.

15. The LED chip package structure as claimed in claim 1, further comprising a frame unit that has a plurality of frame layers respectively covering the fluorescent colloids for exposing the lateral sides of the fluorescent colloids only, wherein each fluorescent colloid has a colloid cambered surface formed on its top surface and a colloid light-exiting surface formed on its front surface, and the frame layers are a plurality of opaque frame layers.

16. The LED chip package structure as claimed in claim 1, further comprising a frame unit covering the fluorescent colloids for exposing the lateral sides of the fluorescent colloids only, wherein each fluorescent colloid has a colloid cambered surface formed on its top surface and a colloid light-exiting surface formed on its front surface, and the frame unit is an opaque frame layer.

17. A LED chip package structure, comprising:

a substrate unit;

a light-emitting unit having a plurality of LED chips electrically arranged on the substrate unit, wherein the LED chips are separated from each other by different spacings;

a package colloid unit covering the LED chips; and a frame unit covering the package colloid unit for only exposing a lateral side of the package colloid unit.

18. The LED chip package structure as claimed in claim 17, wherein the spacings between each two LED chips are from rarefaction to condensation.

19. The LED chip package structure as claimed in claim 17, wherein the spacings between each two LED chips are from condensation to rarefaction.

20. The LED chip package structure as claimed in claim 17, wherein the spacings between each two LED chips are from center rarefaction to outer condensation.

21. The LED chip package structure as claimed in claim 17, wherein the spacings between each two LED chips are from center condensation to outer rarefaction.

22. The LED chip package structure as claimed in claim 17, wherein the spacings between each two LED chips are alternate rarefaction and condensation, or alternate condensation and rarefaction.

* * * * *